United States Patent [19]

Kumanoya et al.

[11] Patent Number: 5,077,688
[45] Date of Patent: Dec. 31, 1991

[54] SEMICONDUCTOR MEMORY DEVICE HAVING IMPROVED MEMORY CELLS PROVIDED WITH CYLINDRICAL TYPE CAPACITORS

[75] Inventors: Masaki Kumanoya; Kazuyasu Fujishima, both of Hyogo, Japan

[73] Assignee: Mitsubishi Denki Kabushiki Kaisha, Tokyo, Japan

[21] Appl. No.: 591,635

[22] Filed: Oct. 2, 1990

[30] Foreign Application Priority Data

Oct. 6, 1989 [JP] Japan .................. 1-262362

[51] Int. Cl.[5] .................. G11C 7/00; G11C 11/404
[52] U.S. Cl. .................. 365/149; 365/174; 357/23.6
[58] Field of Search .................. 365/149, 51, 174; 357/23.5

[56] References Cited

U.S. PATENT DOCUMENTS

| 4,914,628 | 4/1990 | Nishimura | 365/149 |
| 4,953,125 | 8/1990 | Okumura et al. | 365/149 |
| 4,958,318 | 9/1990 | Harari | 365/149 |

FOREIGN PATENT DOCUMENTS 63-313854 12/1988 Japan .

OTHER PUBLICATIONS

W. Wakamiya et al, "Novel Stacked Capacitor Cell for 64Mb Dram", LSI R&D Laboratory, Mitsubishi Electric Corp, pp. 69-70.

Primary Examiner—Alyssa H. Bowler
Attorney, Agent, or Firm—Lowe, Price, LeBlanc & Becker

[57] ABSTRACT

A semiconductor memory device having a storage region constituted with the arrangement of a plurality of memory cells on a main surface of a semiconductor substrate. Each memory cell includes a switching element and a passive element for signal retention connected to the switching element, for retaining the electric charges transferred from the switching element. The passive element includes a central electrode having a generally columnar shape provided protruded on the main surface in a first direction away from the main surface, and the fins constituted with a conductor extending in the first direction and protruded from the outer periphery of the central electrode. Owing to the existence of the fins, the surface area of a signal storage electrode of the passive element is increased. In other words, the quantity of electric charges to be stored is increased.

27 Claims, 13 Drawing Sheets

SEMICONDUCTOR MEMORY DEVICE HAVING IMPROVED MEMORY CELLS PROVIDED WITH CYLINDRICAL TYPE CAPACITORS

BACKGROUND OF THE INVENTION

1. Field of the Invention

The present invention generally relates to a semiconductor memory device, and more specifically, to a semiconductor memory device having storage elements each provided with a capacitor element having three-dimensional structure and capable of accumulating more electric charges.

2. Description of the Background Art

In recent years, to apply the technique of microelectronics to industrial machinery and home appliances, a VLSI (Very-Large-Scale Integration) circuit which is a further integrated LSI (Large Scale Integration) is developed and commercially available. In the case of a semiconductor memory device, especially, the storage capacity has been increased thousand-fold in these ten years. The development of such high integration is realized by miniaturization of the size of a unit storage element, which constitutes a semiconductor memory device, by using a method called a proportional scaling.

FIG. 1 is a block diagram showing an example of a dynamic random access memory (DRAM) for storing information used in a VLSI. In the case of a DRAM one can access the desired information in a fixed access time regardless of its stored address.

Referring to FIG. 1, the DRAM includes: a memory cell array 1000 including a plurality of memory cells constituting a storage section; a row decoder 2000 and a column decoder 3000 connected respectively to a row address buffer 2100 and to a column address buffer 3100 for selecting the address of the DRAM; a control circuit 4000 for controlling the operation of the DRAM; and an input/output interface including sense amplifiers 1100 connected to an input/output circuit. A plurality of memory cells, which constitute the storage section, are disposed in a matrix form having a plurality of rows and columns. Each memory cell is connected to a corresponding word line connected to the row decoder 2000, and to a corresponding bit line connected to the column decoder 3000, to constitute a memory cell array 1000.

In response to the externally applied row address signal and column address signal, a word line and a bit line are selected respectively with the row decoder 2000 and the column decoder 3000. A memory cell is selected with the selected word line and bit line. The externally applied data are stored by the selected memory cell. The data stored in the memory cell are read out in the same manner. The read/write instruction of the data is controlled by a read/write control signal given to the control circuit 4000.

Assuming that the memory cell array 1000 has n word lines and m bit lines, the memory cell array 1000 can store N (=n×m) bit data. The address of the memory cell, to which the data are to be written or from which the data are read out, is retained in the row address buffer 2100 and the column address buffer 3100.

M bits of the memory cells are connected to the sense amplifiers through bit lines by the selection of a specific word line by the row decoder 2000 (selection of one word line out of n word lines). One sense amplifier out of the connected sense amplifiers is connected to the input/output circuit by the following selection of a specified bit line by the column decoder 3000 (selection of one bit line out of m bit lines). Readout or writing is operated in the memory cell connected to the input/output circuit following the instruction from the control circuit 4000.

FIG. 2 shows an equivalent circuit of a unit storage element, or a memory cell, of a DRAM. Referring to FIG. 2, a memory cell MC includes a transistor QM which works as a switching means, having a gate connected to a word line WL and one terminal connected to a bit line; and a capacitor $C_S$ for storing signals having one electrode connected to the other terminal of the transistor QM and the other electrode fixed to a potential $V_{CP}$.

The writing operation of the data to the memory cell MC is performed as follows. The word line WL is activated and the transistor QM turns ON. A high level or low level potential corresponding to the information to be written is supplied to the bit line BL. An electric charge corresponding to the potential of the bit line BL is stored in the capacitor $C_S$; the word line WL is inactivated and the transistor QM is made OFF. The stored charges remain in the capacitor $C_S$.

The readout of data is performed as described in the following. One electrode of the capacitor $C_S$ is fixed to a potential $V_{CP}$ as described above. The bit line BL is kept in a floating condition, electrically isolated from other circuits. When the word line WL is activated, the transistor QM turns ON. The charges stored in the capacitor $C_S$ are given to the bit line BL. The bit line BL has a stray capacitance of about 10 times that of the capacitor $C_S$ and so only a potential change of a few hundred mV is produced in the bit line BL in accordance with the ratio of the capacitance of the capacitor and of the bit line BL. The produced potential change is amplified by the sense amplifier 1100 to be a readout signal.

As mentioned above, the information charges stored in the capacitor $C_S$ are redistributed in the bit line BL in the reading operation to produce the potential change to be detected. The capacitance of the capacitor $C_S$ increases or decreases in proportion to the electrode surface area of the capacitor $C_S$. Consequently, if the size of a capacitor is decreased in the higher integration, the signal charge quantity to be stored is decreased and the potential change is also made smaller, and the possibility of a misread occurs. The soft-error immunity of a memory cell is also lowered with the decrease of the signal charge quantity. In order to prevent this, it becomes necessary to use a capacitor of a specific structure to ensure the capacitance of the capacitor even if the size of it is smaller.

A two-dimensional capacitor called a planar type capacitor is mainly used for a conventional DRAM with the storage capacity less than 1M (mega=million) bits. Referring to FIG. 3, a memory cell using a conventional planar type capacitor includes a transistor 21 provided on a P-type semiconductor substrate 1, and a cell plate 3 adjacent to the transistor 21 opposing to the main surface of the P-type semiconductor substrate 1 with a dielectric film 7 interposed therebetween.

The transistor 21 includes two N+ impurity regions 14 formed with a space interposed therebetween on the P-type semiconductor substrate 1, and a gate electrode 26 formed on the region between the two N+ impurity regions 14 with a gate insulating film between the substrate 1 and the same. The gate electrode 26 is connected to the word line WL. The impurity region 14 that is not adjacent to the 10 cell plate 3 is connected to the bit line BL.

When the word line WL is activated, the transistor 21 turns ON. The potential of the two N+impurity regions 14 substantially equals to that of the bit line BL. The cell plate 3 is connected to a fixed potential $V_{CP}$, thereby electric charges are stored in the part of the main surface of the P-type semiconductor substrate 1 opposed to the cell plate 3.

In the case of a DRAM having a memory cell using a planar type capacitor, electric charges are stored on the main surface of the P-type semiconductor substrate 1, so that a large amount of area is required on the main surface. This type of a memory cell is therefore not suited to high degree of integration. For a DRAM of high degree of integration such as with more than 4M bits of capacity, a three-dimensional capacitor called a stacked type or a trench type has been introduced. FIGS. 4 and 5 show the cross-sectional structures of these types of capacitors.

Referring to FIG. 4, a memory cell with a stacked capacitor includes a transistor 21 formed on the P-type semiconductor substrate 1 and a stacked capacitor 8 adjacent to the transistor 21 on the P-type semiconductor substrate 1. The transistor 21 has the similar structure to that of the transistor 21 shown in FIG. 3. The stacked capacitor 8 includes a storage electrode 4 electrically connected to the N+ impurity region 14 which is not connected to the bit line BL, and a cell plate 3 stacked on the storage electrode 4 with a dielectric film 7 formed therebetween. The storage electrode 4 and the cell plate 3 are formed partly on the transistor 21, thereby the effective area of the charge storing portion of the stacked capacitor 8 is extended.

A memory cell with a trench type capacitor is described in the following referring to FIG. 5. The memory cell includes a transistor 21 provided on the P-type semiconductor substrate 1 and a trench type capacitor 9 provided adjacently to the transistor 21. The trench type capacitor 9 includes a dielectric film 7 formed on the sidewall of a groove 5 formed on the P-type semiconductor substrate 1, and a cell plate 3 formed on the dielectric film 7. The transistor 21 has the similar structure to that of the transistor 21 shown in FIG. 3 or FIG. 4. In the case of a trench type capacitor 9, electric charges are stored on the sidewall 6 and/or the bottom of a groove 5, so that the effective area of a storage electrode is extended. It is applicable to all other type of trench type capacitors.

As described above, it has been made possible to obtain a larger capacity with the similar-sized memory cell. However, to realize a semiconductor device of higher degree of integration such as a VLSI circuit having the capacity of 64M bits, the capacitor of such a simple three-dimensional structure turns out to be insufficient.

A solution for improving the capacitance of a capacitor is proposed in a Japanese Patent Laying-Open No. 63-313854. Referring to FIG. 6, the proposed memory cell of a DRAM includes a transistor 21 formed on a P-type semiconductor substrate 1, a storage electrode 16 having multilayered structure constituted with electrode layers of a plurality of kinds of sizes, formed adjacently to the transistor 21 on the P-type semiconductor substrate 1, a dielectric film, not shown, formed on the surface and along the circumference of the storage electrode 16, and a cell plate, not shown either, formed on the dielectric film.

Since the storage electrode 16 have multilayered structure constituted with the electrode layers having different sizes, grooves are formed on the side of the storage electrode 16 substantially parallel to the main surface of the P-type semiconductor substrate 1. The effective area of the storage electrode 16 is extended by the grooves and more electric charges can be stored therein.

The storage electrode 16 includes an undoped polysilicon film 16A provided on the N+ impurity region of a transistor 21, which is not connected to the bit line BL, and an N+ polysilicon film 16B having smaller area than the undoped polysilicon film 16A and formed on the undoped polysilicon film 16A. A unit element is constituted with an undoped polysilicon film 16A and an N+ polysilicon film 16B. The unit elements are piled up to form grooves 16C on the side of the storage electrode 16 and the effective area of the storage electrode 16 is expanded. Theoretically, the capacitance can be increased limitlessly by piling up unit elements. But this method is not practical. A certain steps of manufacturing are required. Imperfections included in the layers induces a lower yield, and more complicated process. The number of layers, therefore, is limited.

There is another example proposed by Wakamiya et al. in "Novel Stacked Capacitor Cell for 64-Mb DRAM" (1989 Symposium on VLSI Technology Digest of Technical Papers, pp. 69-70). In the paper, a cylindrical capacitor is proposed. FIG. 7 shows a perspective view of the proposed memory cell. FIG. 8 is a plan view of the adjacent two of the proposed memory cells. FIG. 9 is a cross-sectional view taken in the direction of the arrows along the line IX—IX in FIG. 8.

A memory cell of a DRAM using a cylindrical capacitor proposed by Wakamiya et al. will be described referring to FIGS. 7 to 9 in the following. The memory cell includes: a P-type semiconductor substrate 1, a field-isolation oxide film 23 constituted with a thick oxide film formed on the P-type semiconductor substrate 1 for separating memory cells from each other; a transistor 21 with a gate electrode 26 of the first word line provided where there is no field-isolation oxide film 23; and a hollow cylindrical capacitor 10 connected to the transistor 21 and formed on the transistor 21 and the field-isolation oxide film 23. An insulating film 34 is formed on the P-type semiconductor substrate 1 and on the field-isolation oxide film 23. On the part of the insulating film 34 formed on the field-isolation oxide film 23, a second word line 27 is disposed for driving other memory cells provided along the direction of a word line.

The transistor 21 includes two N+ impurity regions 24 formed with a space therebetween on the semiconductor substrate 1 and a gate electrode 26 formed on the main surface of the P-type semiconductor substrate 1 between the two N+impurity regions 24 with a dielectric film 25 formed therebetween. The insulating film 34 is formed on the gate electrode 26 upon which a nitride film 35 for masking is formed.

The cylindrical capacitor includes: a lower electrode 28 constituted with polysilicon layers bordering on an N+ impurity region 24 and formed over the insulating film 34 and the nitride film 35; a hollow cylindrical electrode 28a constituted with polysilicon and integrally formed on the lower electrode 28; a dielectric film 29 (not shown in FIG. 7) formed on the cylindrical electrode 28a; and a conductive layer 30 (not shown in FIG. 7) formed on the dielectric film 29.

Referring particularly to FIG. 9, an interlayer insulating film 40 is formed in the memory cell. A bit line 42 is formed with tungsten silicide film, etc. on the interlayer insulating film 40. On an N+ impurity region 24, to which the cylindrical capacitor 10 is not connected, a contact hole 41 is formed in the insulating film 40. A tungsten silicide film 43 is formed inside the contact hole 41. The bit line 42 is electrically connected to an $N^{30}$ impurity region 24 with the tungsten silicide film 43.

In a memory cell having the constitution as mentioned above, when a word line (a gate electrode) 26 is activated, the transistor 21 turns ON. The bit line 42 is electrically connected to the lower electrode 28 and the cylindrical electrode 28a. When data are to be written, the charges corresponding to the potential of the bit line 42 are stored in the lower electrode 28 and the cylindrical electrode 28a. When data are readout, the charges stored in the lower electrode 28 and the cylindrical electrode 28a are given to the bit line 42.

In a memory cell using a proposed cylindrical capacitor, the storage capacitance can be increased by making the cylindrical electrode 28a higher. Electric charges are stored not only on the outer-peripheral surface but also on the inner-peripheral surface of the cylindrical electrode 28a, so that the capacitance is effectively increased with the height of the cylindrical electrode 28a.

Among the examples described above, the last two make it possible to realize higher degree of integration of a semiconductor memory device. For the realization of a semiconductor memory device, however, with more than 256-Mb storage capacity for example, there are problems still to be solved.

In a stacked capacitor with multilayered structure as shown in FIG. 6, to increase the storage capacitance, it is necessary to form a plurality of layers constituted with an undoped polysilicon film 16A and an N+ polysilicon film 16B. The fabricating procedure of the capacitors of this type includes may steps; therefore it is not economical to manufacture this kind of capacitors. In addition, it is difficult to fabricate this type of capacitors having high reliability.

The cylindrical capacitor shown in FIGS. 7 to 9 has merit in that the hollow cylindrical electrode can be formed with only one patterning. To realize a DRAM with a storage capacity of more than 256-Mb, however, it is necessary to make the diameter of a hollow cylindrical electrode 28a smaller. Since it is difficult to make the cylindrical electrode 28a very high, it cannot be avoided to decrease the capacitance of a memory cell. Consequently, it is difficult to fabricate a DRAM of higher degree of integration or to realize the operation of high reliability using the memory cells of this type.

SUMMARY OF THE INVENTION

Therefore, an object of the present invention is to provide a semiconductor memory device with memory cells capable of higher integration which can operate with high reliability.

Another object of the present invention is to provide a semiconductor memory device with memory cells capable of operating with high reliability which occupy smaller are on a substrate.

A still another object of the present invention is to provide a semiconductor memory device capable of higher integration in which the readout signal is easily detected.

A further object of the present invention is to provide a semiconductor memory device capable of higher integration with improved soft-error immunity.

A still further object of the present invention is to provide a semiconductor memory device capable of higher integration with memory cells having capacitors of large storage capacitance.

Another object of the present invention is to provide a semiconductor memory device with memory cells with capacitors occupying a smaller amount of area on the substrate with larger amount of area of storage electrodes.

A semiconductor memory device according to the present invention has a storage region having an arrangement of a plurality of memory cells each having a passive element for signal retention. The storage region is formed on a main surface of a semiconductor substrate. The passive element includes a first conductive portion having a generally columnar shape formed protruded from the main surface in a first direction away from the main surface and being electrically connected to a switching element. The first conductive portion has an outer-peripheral surface and a surface feature including at least one concave region formed on a surface of the first conductive portion. The passive element further includes a dielectric film covering the surface of the first conductive portion; and a second conductive layer covering the dielectric film.

Electric charges transferred from the switching means are stored in the first conductive portion of the passive element for signal retention. The concave region is formed on the surface of the first conductive portion so that the area of the region where electric charges are stored is expanded by far compared to the case without the concave region. The effective storage capacitance of the passive element for signal retention is thereby increased. It is therefore possible to further integrate a semiconductor memory device without reducing the storage capacitance. Even when the height of the first conductive portion protruded from the surface of the semiconductor substrate is set low, enough storage capacitance can be secured to improve the reliability in the readout operation.

According to a preferred embodiment of the present invention, at least one of the concave region defines a second conductive portion on the outer-peripheral surface of the first conductive portion. According to a more preferred embodiment of the present invention, each first conductive portion has a predetermined number of the second conductive portions. With the increase of the number of the second conductive portions, the area of the charge storage part of the passive element for signal retention increases, whereas the occupied area on the substrate by the cells does not increase. Consequently, the quantity of stored electric charges is much increased and the soft-error immunity of memory cells is remarkably improved.

According to a still more preferred embodiment of the present invention, a semiconductor memory device includes a first memory cell and a second memory cell. The second memory cell is next to the first memory cell. The first and second memory cells are alligned in a predetermined second direction with a predetermined first distance therebetween. The second conductive portions of the first memory cell extend between the second conductive portions of the second memory cell.

Owing to the arrangement of the memory cells as described above, the second conductive portions can be provided effectively utilizing the space between the cells. In other words, the required area can be reduced without changing the size of each cell, thereby making it possible to further integrate a semiconductor memory device.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
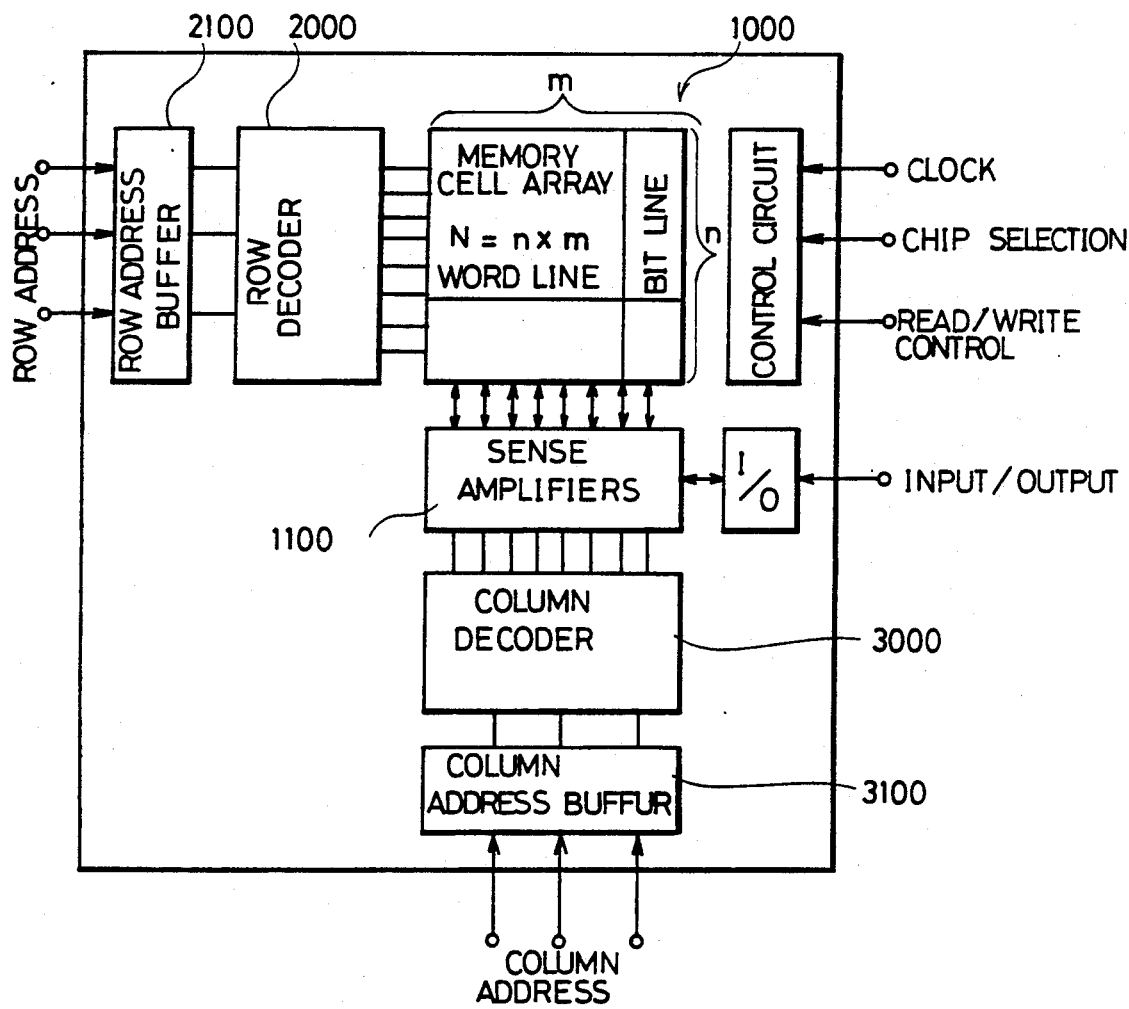
FIG. 1 is a schematic block diagram of a DRAM.
Figure 2:
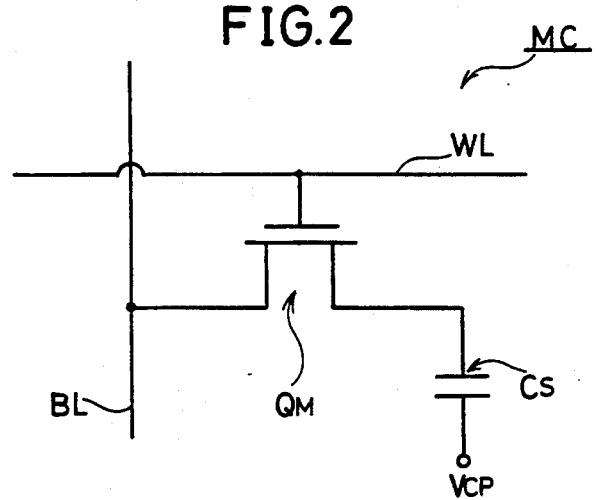
FIG. 2 is an equivalent circuit of a memory cell.
Figure 3:
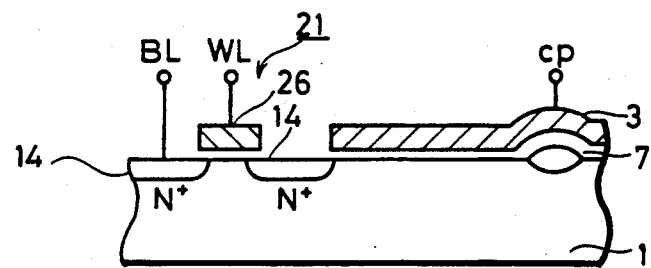
FIG. 3 is a cross-sectional view of a memory cell with a planar type capacitor.
Figure 4:
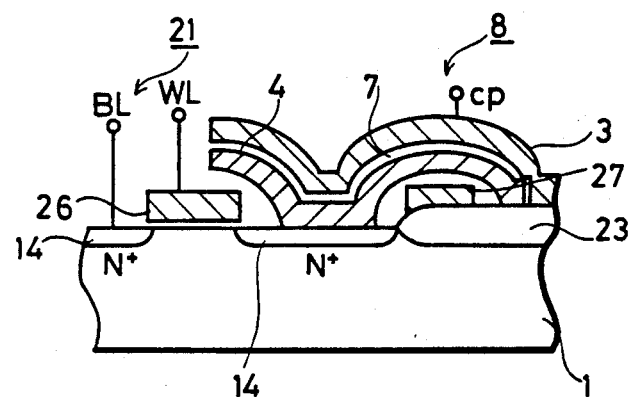
FIG. 4 is a cross-sectional view of a memory cell with a stacked type capacitor.
Figure 5:
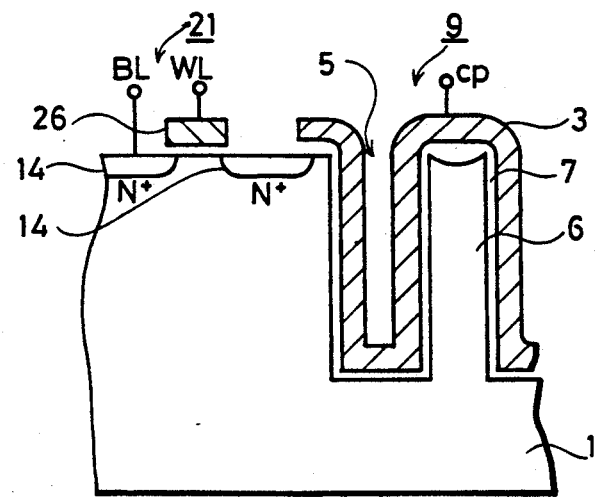
FIG. 5 is a cross-sectional view of a memory cell with a trench type capacitor.
Figure 6:
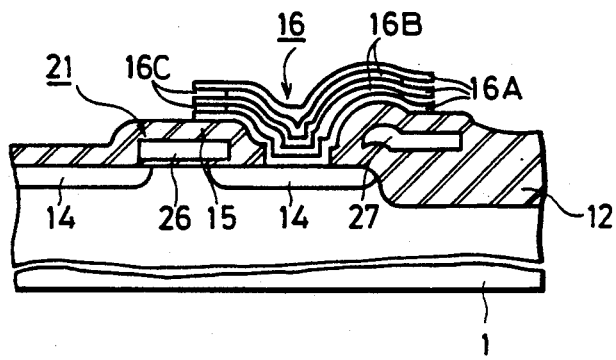
FIG. 6 is a cross-sectional view of a memory cell with a stacked type capacitor of multilayer structure.
Figure 7:
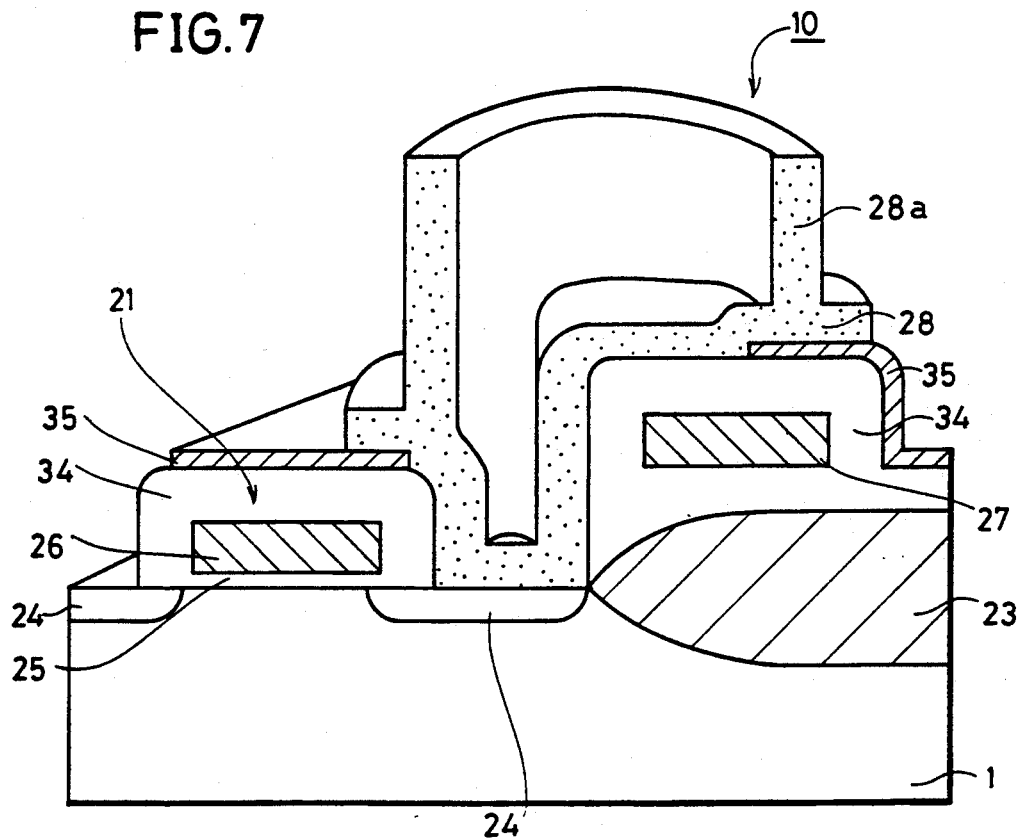
FIG. 7 is a perspective view of a proposed memory cell with a hollow cylindrical capacitor.
Figure 10:
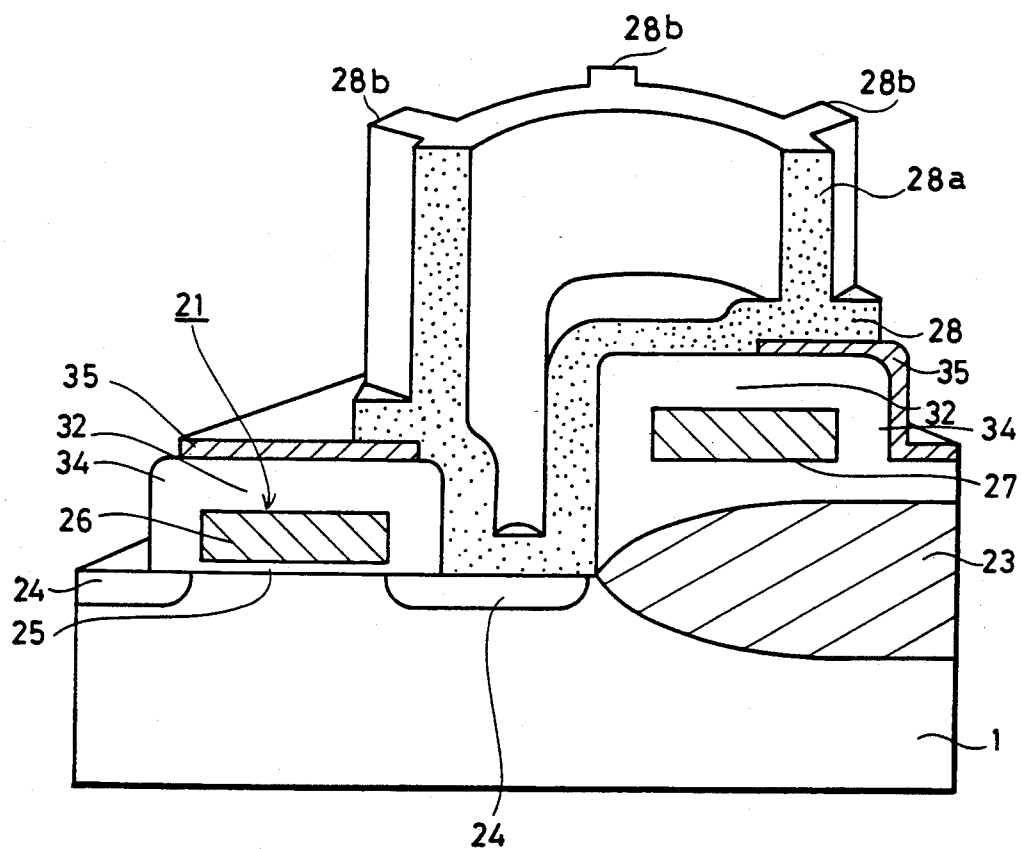
FIG. 10 is a cross-sectional view in perspective of a memory cell being formed in a semiconductor memory device according to the present invention.

Referring to FIG. 10, the identical structural components to those of the memory cells shown in FIG. 7 are given the identical numerals and the names. Detailed descriptions thereof, therefore, are not repeated here. It should be noted that only one electrode of a cylindrical capacitor is shown in FIG. 10.

Referring to FIG. 10, the difference between this memory cell and the memory cell shown in FIG. 7 is that this memory cell has the fins 28b. The fins 28b are defined by the concave regions formed on the outer-periphery of a hollow cylindrical electrode 28a. The fins 28b extends in the direction of height. The total amount of the surface area of the hollow cylindrical electrode 28a and the fins 28b is much increased by the fins 28b compared to that of a hollow cylindrical electrode 28a only. The quantity of electric charges stored in the capacitor of this memory cell is therefore much increased.

Figure 8:
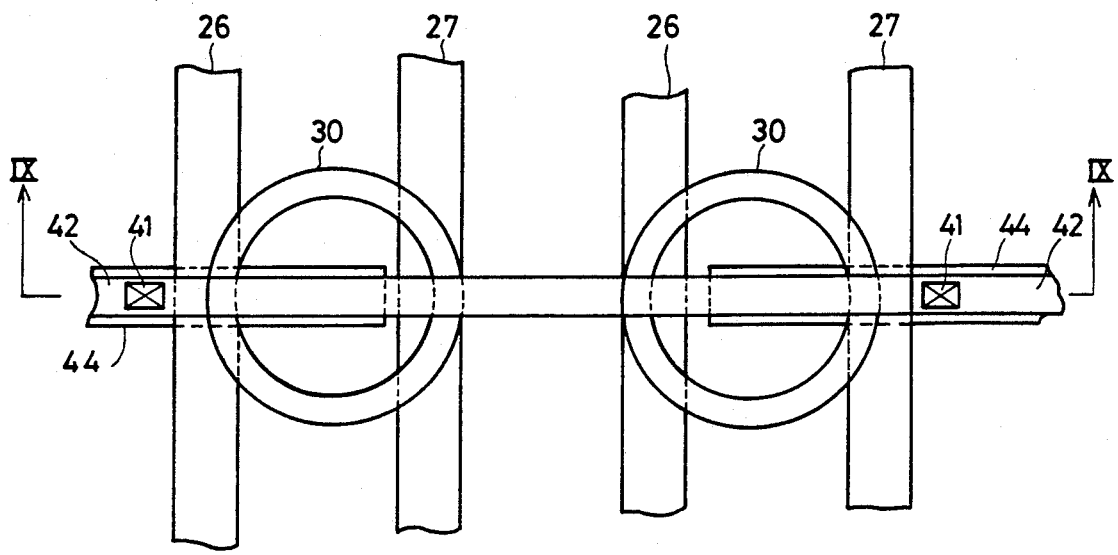
FIG. 8 is a schematic plan view of a storage region showing the arrangement of the memory cells shown in FIG. 7.
Figure 9:
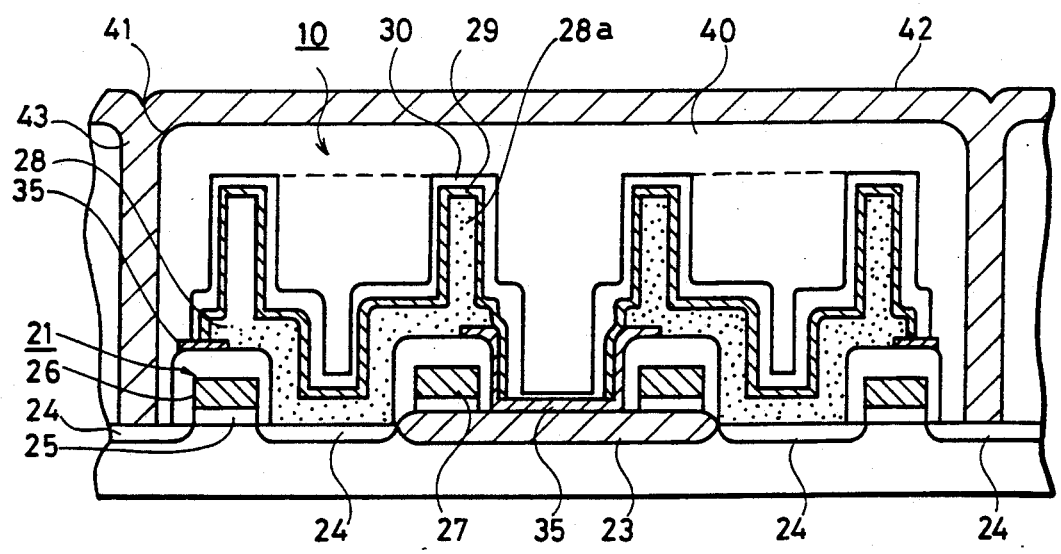
FIG. 9 is a cross-sectional view taken in the direction of the arrows along the line IX—IX in FIG. 8.
Figure 11:
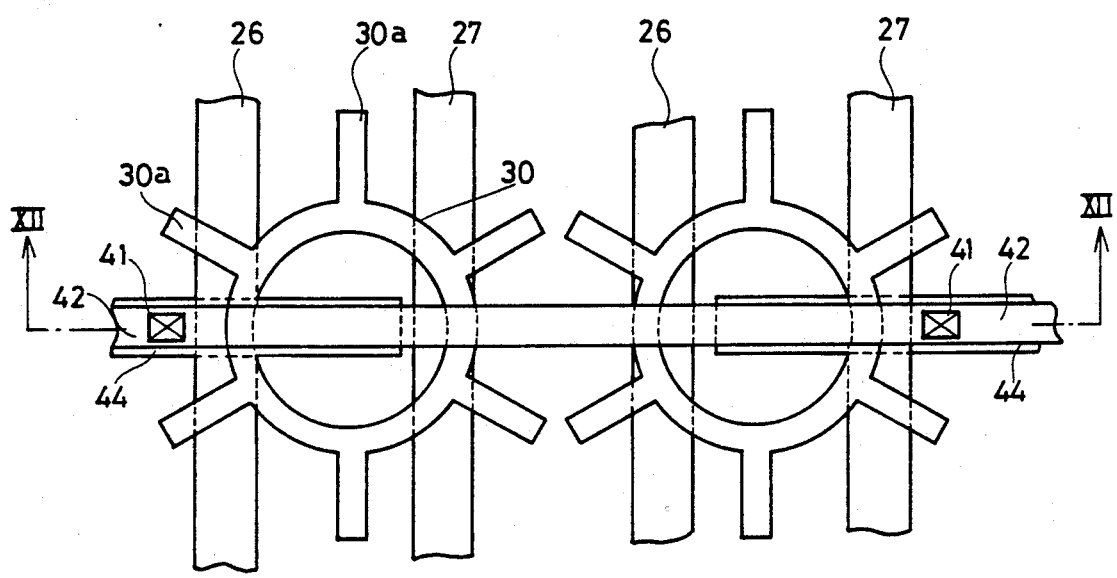
FIG. 11 is a plan view showing two memory cells in a semiconductor memory device according to the present invention.
Figure 12:
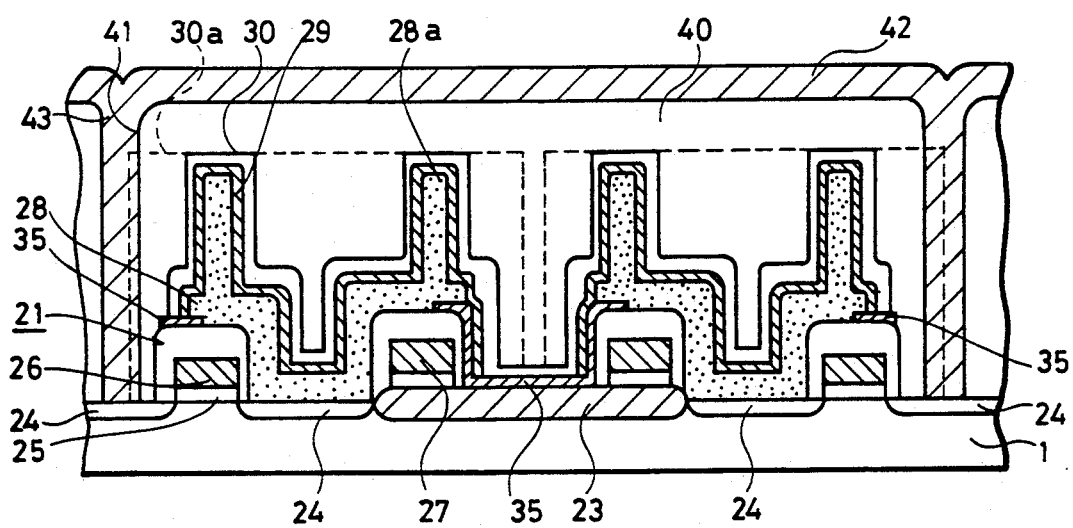
FIG. 12 is a cross-sectional view in the direction of the arrows along the line XII—XII in FIG. 11.

The plan views of the hollow cylindrical electrode 28a and the fins 28b will be described in the following. In FIGS. 11 and 12, like numerals and names are given to the like structural components of a memory cell as shown in FIG. 8 and FIG. 9. The detailed descriptions of them, therefore, are not repeated here. The significant features of the memory cell are described in the following.

A dielectric film 29 is formed on the surface of a hollow cylindrical electrode 28a and fins 28b shown in FIG. 10. A conductive film 30 is further formed on the dielectric film 29 formed on the cylindrical electrode 28 a. A conductive film 30a is similarly formed on the dielectric film 29 formed on the fins 28b. The plan view of this capacitor cell has, therefore, a circular form in the center and a plurality of fins protruded from the circumference of the circular form as shown in FIG. 11.

The capacitance of the capacitor of the memory cell is much increased in comparison with a cylindrical capacitor without the fins occupying the same area on the P-type semiconductor substrate 1, being provided with fins 28b on the circumference of the hollow cylindrical electrode 28a. The height required of a cylindrical electrode 28a can be much reduced in comparison with a capacitor without the fins to obtain the same storage capacitance. The fabrication of semiconductor memory devices using these memory cells becomes much easier.

In another aspect, to obtain the same storage capacitance, the above-mentioned memory cell requires much smaller area than the memory cell without the fins if the heights of cylindrical electrodes are the same. Thereby it is possible to realize a semiconductor memory device capable of further integration.

A further feature of a memory cell of a semiconductor memory device according to the present invention will be described in the following. What is significant is that the whole area occupied by a semiconductor memory device can be reduced using a cylindrical capacitor cell of identical height and dimensions in the plan view by contriving the arrangement of the fins 28b on the hollow cylindrical electrode 28a.

Figure 13:
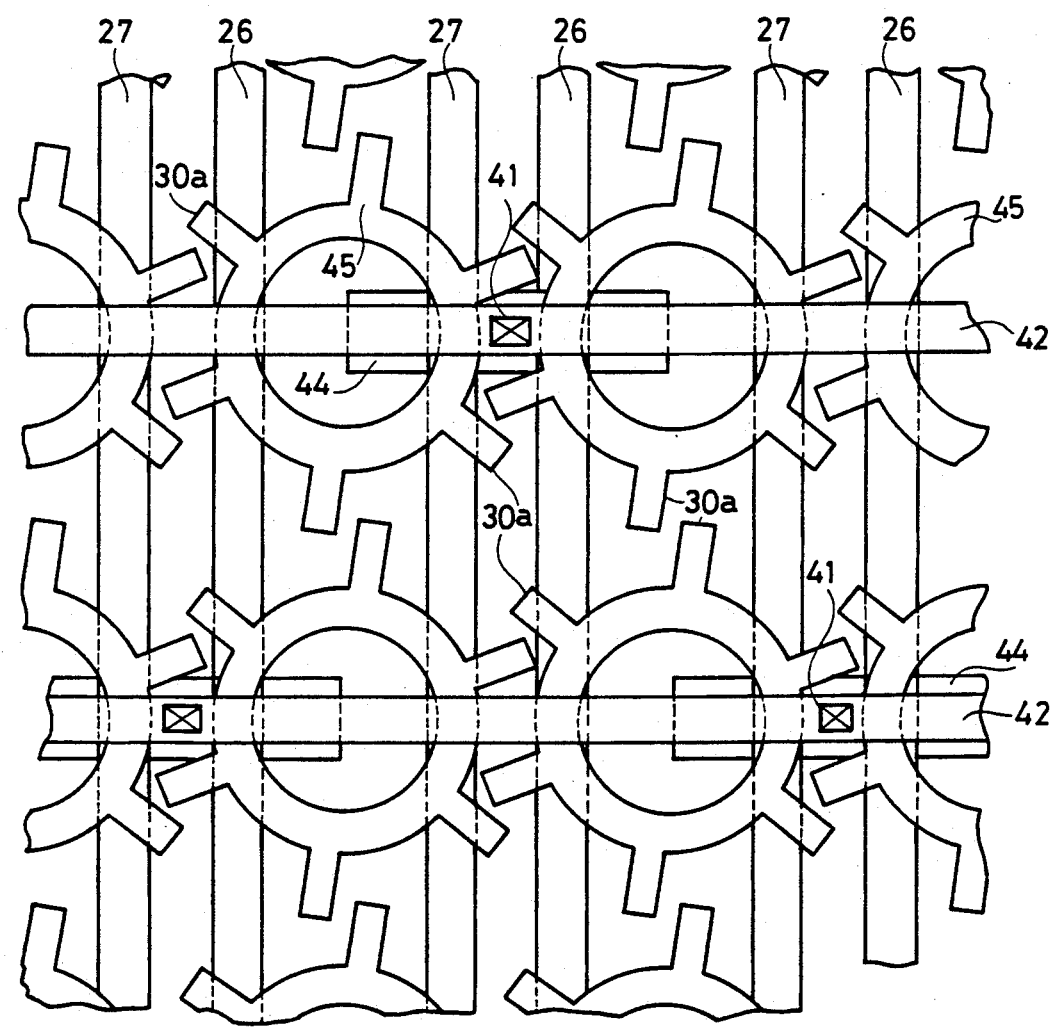
FIG. 13 is a schematic plan view of a storage region showing the arrangement of memory cells in a semiconductor memory device according to the present invention.

FIG. 13 shows an example of such an arrangement. Referring to FIG. 13, six fins 30a are provided on each capacitor 45. Six fins 30a are disposed centering a cylindrical capacitor 45 making 60 degrees of angles with each other. Any pair of fins 30a opposed to each other centering the cylindrical capacitor 45 is parallel neither to the bit line 42, nor to the word lines 26 and 27. Memory cells can be disposed so that a fin of a memory cell is provided between two fins of another memory cell by selecting the positions of fins 30a properly.

By the arrangement as described above, the intervals between memory cells can be made smaller. It is therefore possible to further integrate a semiconductor memory device. The fins 30a of each memory cell form a plan view similar to that of gears intermeshing with each other as shown in FIG. 13. Any fin 30a does not overlap with the bit line 42, so that a contact hole can be formed in the region right under the bit line 42 located at the intermediate position between the adjacent two memory cells. The word lines 26 and 27 are disposed to make a right angle with the bit line 42. Around the contact hole 41 an element formation region 44 is formed and a transistor not shown in the drawing is formed thereon.

By arranging memory cells as described above, in spite of a plurality of fins provided on each of these cylindrical capacitors 45, the required area on the P-type semiconductor substrate 1 for forming the memory cells does not increase, thereby making it easy to realize further integration.

In the embodiment shown in FIGS. 10 to 13, six fins 30a are radially formed making an angle of 60 degrees with each other around the hollow cylindrical capacitor 45. However, the shape of a capacitor of a memory cell is not limited to this. Any capacitor can be employed which has a center portion having a generally columnar shape protruded on the P-type semiconductor substrate 1 and the fins provided around the center portion and extending in the direction of the height of the center portion.

Figure 14:
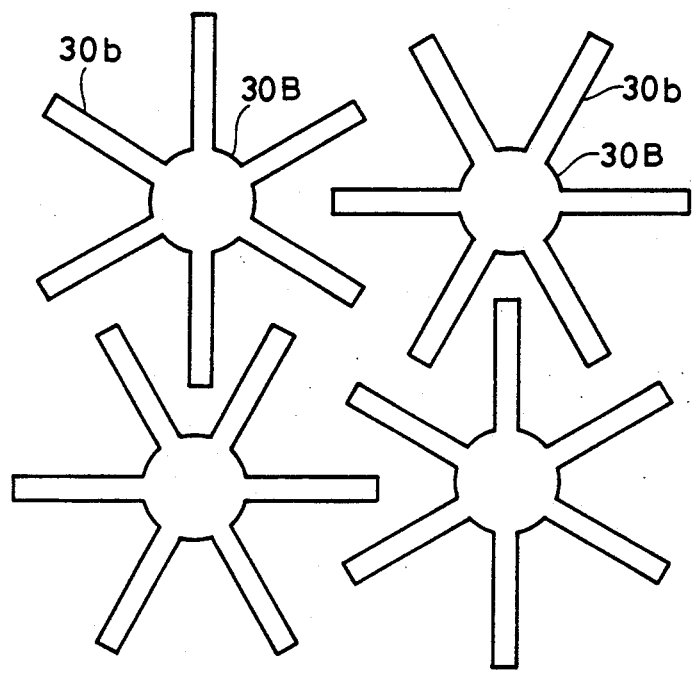
FIGS. 14 to 17 are plan views showing examples of the arrangement of memory cells in a semiconductor memory device according to the present invention.

An example is shown in FIG. 14. Referring to FIG. 14, the storage electrode of a memory cell includes a cylindrical electrode 30B provided in the center and six fins 30b protruded from the circumference of the cylindrical electrode 30B. Gains of capacitance is greater if the cylindrical electrode 30B is hollow. But the miniaturization of the device may be make it difficult to form the hollow cylindrical electrodes. Even in such a case, the fins may be provided to expand the area of the electrodes.

Figure 15:
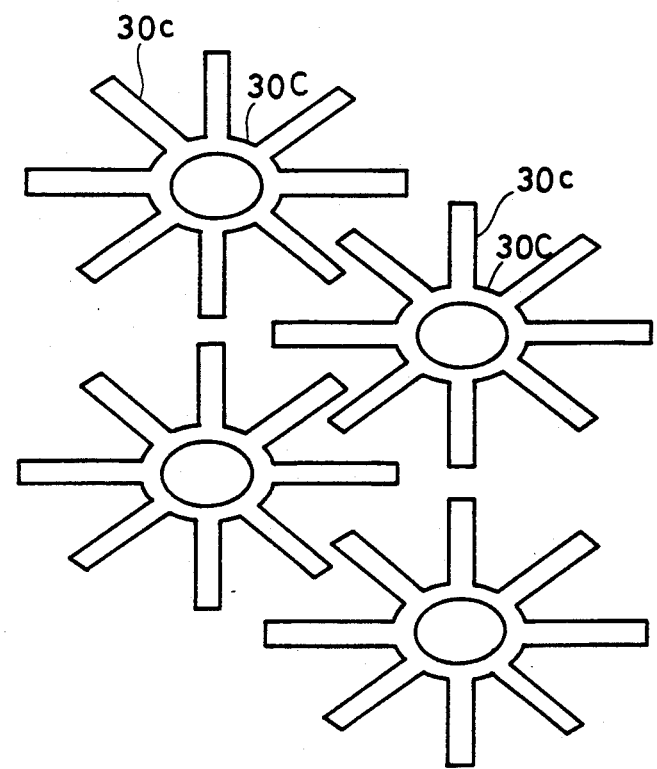
Figure 16:
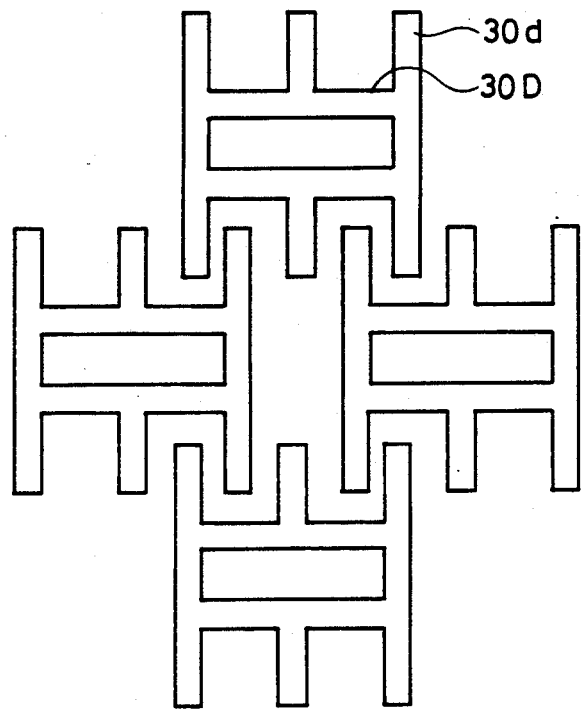
Figure 17:
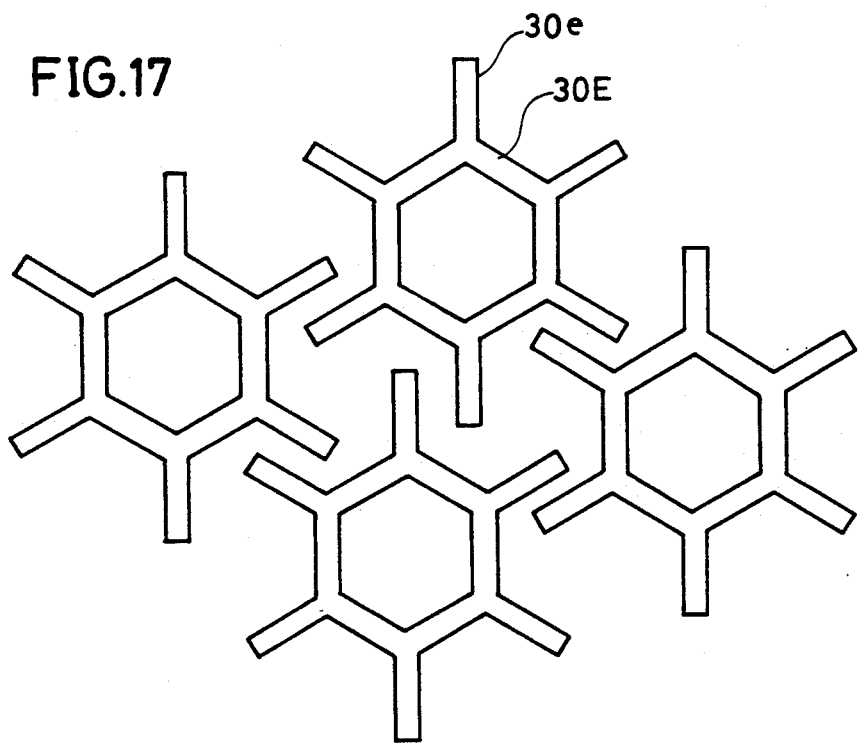

FIGS. 15 to 17 show the plan views of storage electrodes in three other embodiments of memory cells of semiconductor memory devices according to the present invention. Referring to FIG. 15, a storage electrode of a memory cell in one embodiment has a hollow cylindrical electrode 30C provided on a substrate protruded therefrom and eight fins 30c provided around the cylindrical electrode 30c. The fins 30c are surrounding the outer periphery of the cylindrical electrode 30C making 45 degrees with each other. The dimensions of two fins opposing to each other are equal, but the dimensions of four pairs of fins 30c are not necessarily equal.

Referring to FIG. 16, in a memory cell in another embodiment, a storage electrode includes a hollow square tube 30D with a rectangular section, and six fins 30d three out of which are respectively provided on the opposed longer sides of the square tube 30D.

Referring to FIG. 17, in a memory cell in still another embodiment, a storage electrode includes a hollow hexagonal tube 30E with a hexagonal section and six fins 30e, each of which provided along a vertex side of the hexagonal tube 30E.

In each of the above-mentioned embodiments, owing to the existence of fins, the quantity of the electric charges stored in the storage electrode is remarkably increased compared with that of a conventional memory cell.

In the above-mentioned embodiments, 6 or 8 fins are formed for each storage electrode, but the present invention is not limited thereto. The number of fins to be provided to a memory cell can be less than 6 or more than 8. Needless to say, a memory cell can have 7 fins. There can be varieties in numbers of fins for a plurality of memory cells within the same device. Similar efficiency can be obtained when each fin is different in thickness, width or length. The electrodes shown in FIGS. 15-17 can be fabricated without the central hollow portion.

In the next, the fabricating procedure of a memory cell for a semiconductor memory device according to the present invention will be described referring to FIGS. 18A to 18L.

Figure 18A:
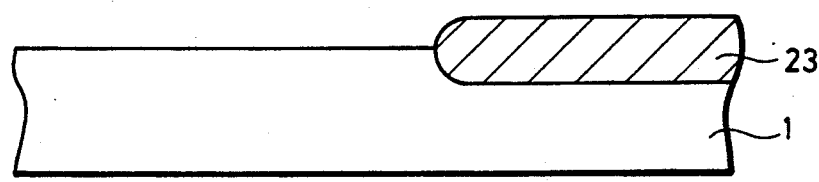
FIGS. 18A to 18L are cross-sectional views of memory cells showing a fabricating procedure of a semiconductor memory device according to the present invention.

Referring to FIG. 18A, a thick field-isolation oxide film 23 is formed in a predetermined region on the surface of a P-type semiconductor substrate 1 by using, for example, the LOCOS (Local Oxidation of Silicon) method.

Figure 18B:
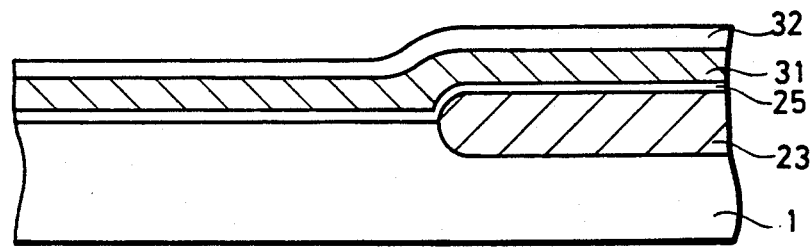

Referring to FIG. 18B, the surface of the P-type semiconductor substrate 1 is heat-oxided and an oxide film 25 is formed on the surface of the semiconductor substrate 1 surrounded by the field-isolation oxide film 23. On the oxide film 25, a polysilicon layer 31 doped with phosphor is formed by a low pressure CVD method. On the silicon layer 31 an insulating film 32 is formed by the low pressure CVD method.

Figure 18C:
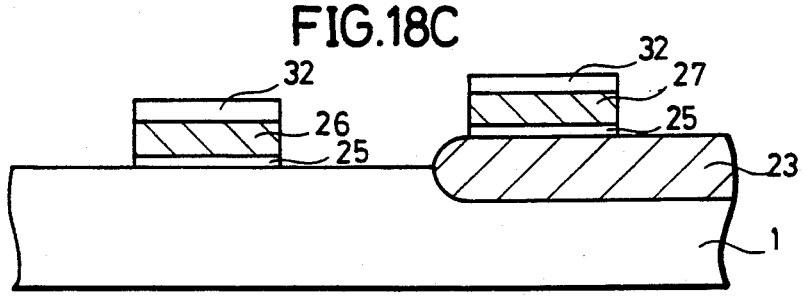

Referring to FIG. 18C, the insulating film 32, the polysilicon layer and the oxide film 25 are patterned after predetermined patterns by the photolithographic method and the dry etching method. Thus the gate oxide film 25, the gate electrode 26 and the word line 27 of the transistor 21 are formed.

Figure 18D:
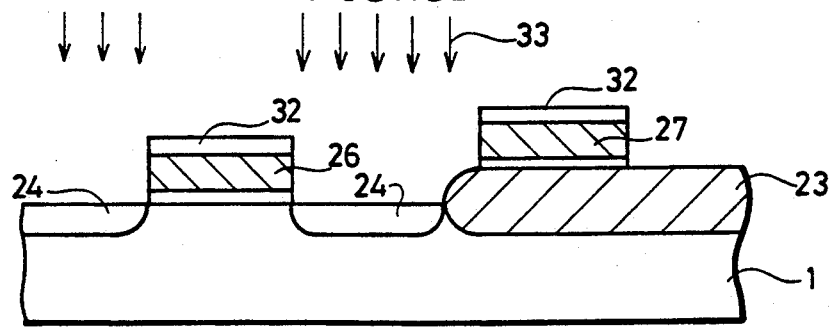

Referring to FIG. 18D, impurity ions 33 are implanted into the P-type semiconductor substrate 1 with the masking of the patterned gate electrode 26 etc. Two N+ impurity regions 24 are formed on both sides of the gate electrode 26 on the semiconductor substrate 1.

Figure 18E:
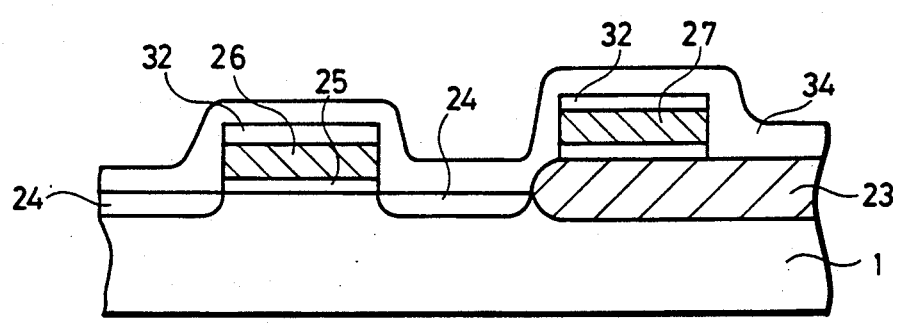

Referring to FIG. 18E, an insulating film 34 of an oxide film etc. is deposited with a low pressure CVD method on the whole surface of a semiconductor complex formed on the P-type semiconductor substrate 1.

Figure 18F:
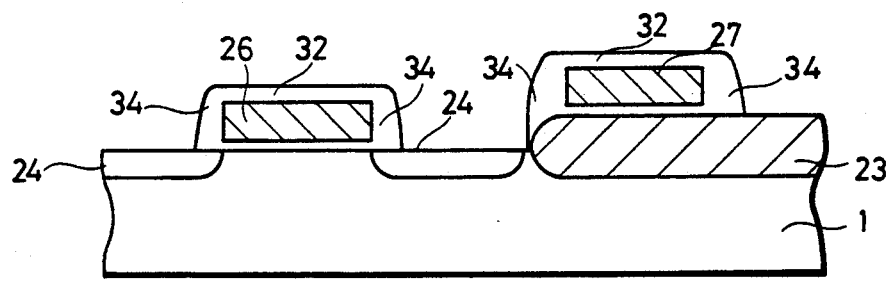

Referring to FIG. 18F, the insulating film 34 is selectively removed by anisotropic etching. Insulating films 32 and 34 are selectively left only on the upper surfaces and side surfaces of the gate electrode 26 and the word line 27.

Figure 18G:
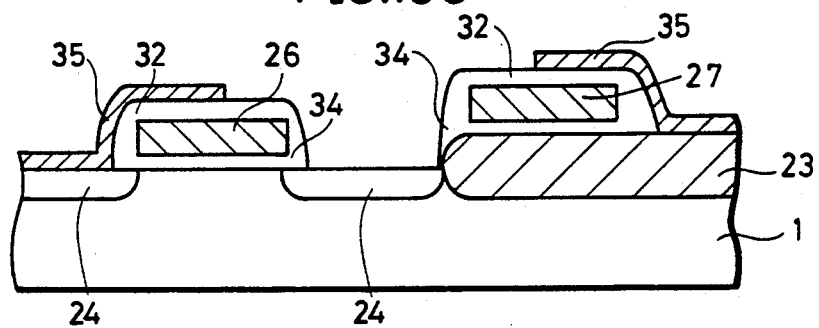

Referring to FIG. 18G, a nitride film 35 is deposited on the whole surface of the P-type semiconductor substrate 1 with a low pressure CVD method. The nitride film 35 is patterned after a predetermined pattern.

Figure 18H:
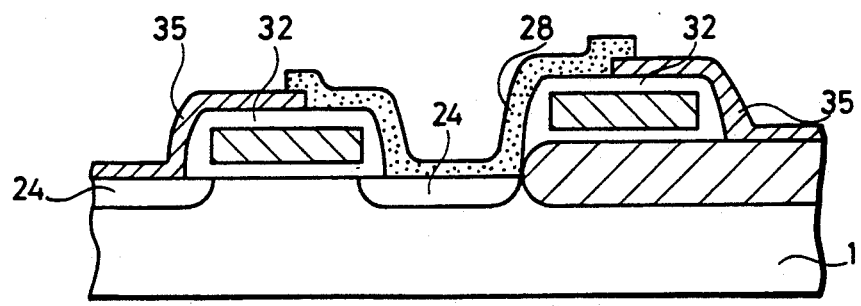

Referring to FIG. 18H, a polysilicon layer is deposited on the surface of the nitride film 35 etc. with a low pressure CVD method. The polysilicon layer is patterned after a prescribed pattern with the photolithographic method and the etching method to form a lower electrode 28; both end portions of the lower electrode 28 and the fins 28b are patterned to be located on the nitride film 35.

Figure 18I:
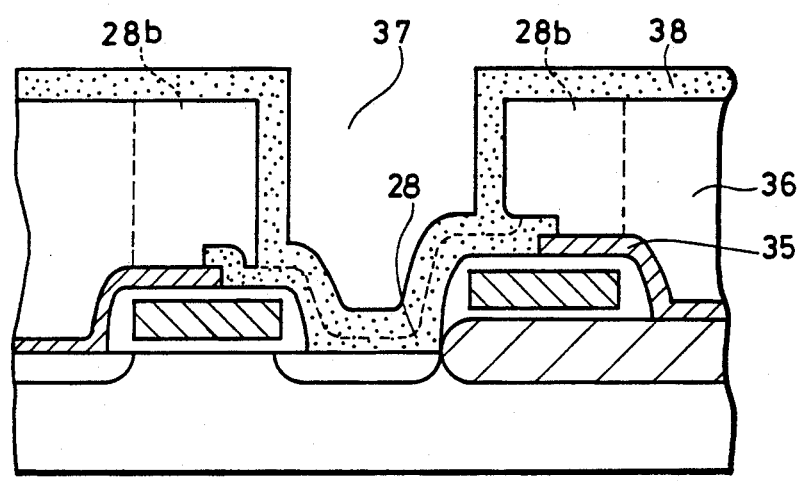

Referring to FIG. 18I, a thick insulating film 36 is deposited on the lower electrode 28, fins 28b and the nitride film 35 with a CVD method. The thickness of the insulating film 36 defines the height of a cylindrical electrode to be formed in the later process. An opening 37 is formed in a prescribed position of the insulating film 36. The plan view of the opening part 37 is, as is shown in FIG. 11, a circular with six portions protruded therefrom. The patterning can be obtained with only one process as previously mentioned. The polysilicon layer 38 is deposited on the surface of the insulating film 36 and on the inner part of the opening 37.

Figure 18J:
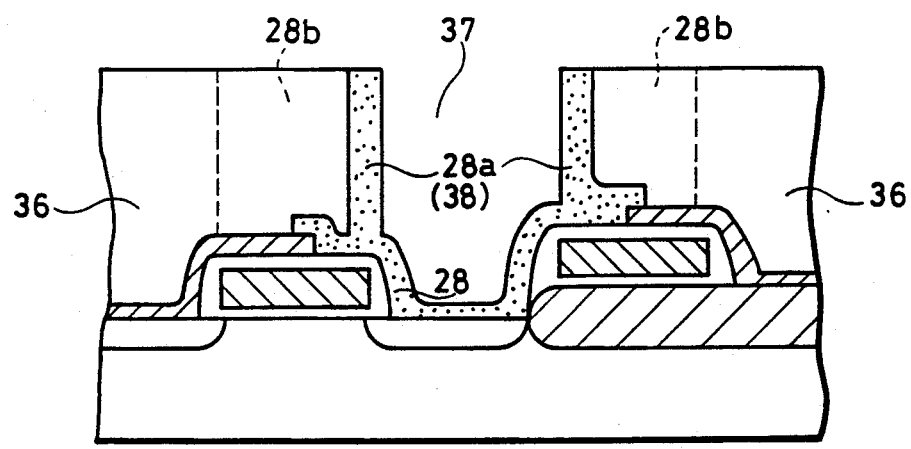

Referring to FIG. 18J, the polysilicon layer 38 is selectively removed with anisotropic etching. In this process the polysiclicon layer 38 deposited on the flat surface of the insulating film 36 and on the upper surface of the lower electrode 28 is selectively removed. At the same time the polysilicon layer 38 deposited on the inner surface of the opening 37 is selectively left. The cylindrical electrode 28a united with the lower electrode 28 is formed in this etching process.

Figure 18K:
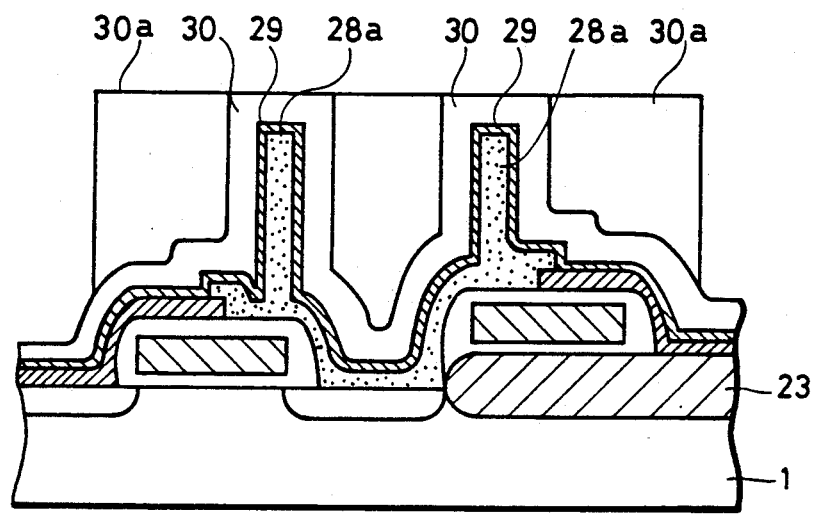

Referring to FIG 18K, a nitride film is deposited on the whole surface with the low pressure CVD method after the insulating film 36 is removed. The semiconductor substrate 1 is heat-treated in oxygen atmosphere and a part of the deposited nitride film is oxidized. Thus, the dielectric film 29 constituted with a compound film of a nitride and an oxide film is formed. The dielectric film 29 is formed to completely cover the surfaces of the lower electrode 28, the cylindrical electrode 28a and the fins 28b (not shown). Furthermore, a polysilicon layer is deposited by using a low pressure CVD method. The polysilicon layer and the dielectric film 29 are patterned after prescribed patterns to form the conductive film 30 and the conductive film on fins 30a.

Figure 18L:
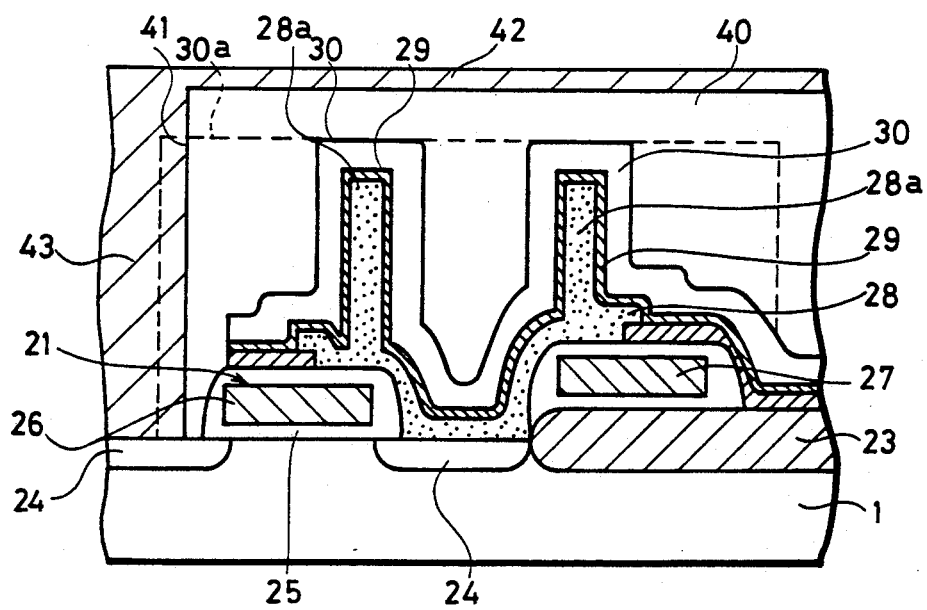

Referring to FIG. 18L, an interlayer insulation film 40 such as an oxide film is deposited thickly on the whole surface of the semiconductor complex with the CVD method. A contact hole 41 is formed in the interlayer insulation film 40 for the contact to an N+ impurity region 24. A tungsten silicide film 43 is selectively formed in the contact hole 41 with the CVD method. A tungsten silicide film etc. are formed on the surface of the tungsten silicide film 43 and on the surface of the interlayer insulation film 40 with the spattering method. The layer is patterned after a prescribe pattern. A bit line 42 is formed in this process. Thus a memory cell of a DRAM is fabricated.

The material of interconnecting layers such as a bit line 42 in the above-mentioned embodiments is not limited to a tungsten silicide film. For example, a polysilicon layer film, a metallic silicide film a metallic film or TiN (titanium nitride) film can be used in place of a tungsten silicide film.

As shown clearly in the above, in the case of the semiconductor memory device according to the present invention a storage electrode can be easily formed in one process. Therefore the manufacturing procedure is not made to be more complicated by providing the fins. Even when the fins of memory cells are disposed like intermeshing toothed wheels the manufacturing procedure is not changed at all, thereby making it possible to easily improve the degree of integration.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor memory device having a storage region having an arrangement of a plurality of unit memory cells formed on the main surface of a semiconductor substrate of a first conductivity type, wherein
each of said memory cells comprises:
a switching means formed on said main surface of said semiconductor substrate, and
a passive element for signal retention connected to said switching means for retaining the electric charges transferred from said switching means,
said switching means comprising:
a first and a second conduction electrodes; and
a gate electrode for controlling the conduction between said first and second conduction electrodes,
said passive element for signal retention comprising:
a first conductive portion having a generally columnar shape formed protruded from said main surface in a first direction away from said main surface, and electrically connected to said switching means,
said first conductive portion having an outer-peripheral surface, and
said first conductive portion having a surface feature comprising at least one concave region formed by two second conductive portions, located on and extending from said outer-peripheral surface of said first conductive portion;
a dielectric film covering said surface of said first conductive portion including said surface feature; and
a conductive layer covering said dielectric film whereby the area of said first conductive portion and said conductive layer is increased.

2. A semiconductor memory device according to claim 1, wherein
each of said second conductive portions is arranged along said outer-peripheral surface in said first direction.

3. A semiconductor memory device according to claim 2, wherein said first conductive portion has a predetermined number of said second conductive portions.

4. A semiconductor memory device according to claim 3, wherein said predetermined number is the same for all of said memory cells.

5. A semiconductor memory device according to claim 4, wherein said predetermined number is a predetermined even number.

6. A semiconductor memory device according to claim 5, wherein said predetermined even number is six.

7. A semiconductor memory device according to claim 2, including
a first said memory cell, and
a second said memory cell provided next to said first memory cell,
wherein said first and second memory cells are aligned in a predetermined second direction with a predetermined first distance therebetween,
said second conductive portions of said first memory cell extending between said second conductive portions of said second memory cell.

8. A semiconductor memory device according to claim 7, wherein said second conductive portion of said first memory cell is formed in a third direction crossing said second direction.

9. A semiconductor memory device according to claim 8, wherein said second conductive portion of said second memory cell is formed in a fourth direction crossing said second direction.

10. A semiconductor memory device according to claim 9, wherein the total amount of the length of said second conductive portion of said first memory cell in said third direction and the length of said second conductive portion of said second memory cell in said fourth direction is longer than said first distance.

11. A semiconductor memory device according to claim 10, wherein said third direction and said fourth direction are parallel to each other.

12. A semiconductor memory device according to claim 1, wherein
said first conductive portion has an upper surface substantially parallel to said main surface.

13. A semiconductor memory device according to claim 12, wherein
a concavity is formed in a central portion of said upper surface of said first conductive portion,
said first conductive portion having an inner-peripheral surface parallel to said first direction besides said outer-peripheral surface, and said inner-peripheral surface defining the sidewall of said concavity.

14. A semiconductor memory device according to claim 13, wherein said upper surface of said first conductive portion has a first circular form.

15. A semiconductor memory device according to claim 14, wherein said concavity has a second circular form on said upper surface.

16. A semiconductor memory device according to claim 15, wherein said first circular form and said second circular form are concentric.

17. A semiconductor memory device having a storage region having an arrangement of a plurality of unit memory cells formed on the main surface of a semiconductor substrate of a first conductivity type, wherein each of said memory cells comprises:
a switching means formed on said main surface of said semiconductor substrate, and
a passive element for signal retention connected to said switching means for retaining the electric charges transferred from said switching means,
said switching means comprising:
a first and a second conduction electrodes; and
a gate electrode for controlling the conduction between said first and second conduction electrodes,
said passive element for signal retention comprising:
a first conductive portion having a generally columnar shape formed protruded from said main surface in a first direction away from said main surface, and electrically connected to said switching means,
said first conductive portion having an outer-peripheral surface, and
said first conductive portion having a surface feature comprising at least one concave region formed by two second conductive portions, located on and extending from said outer-peripheral surface of said first conductive portion;
a dielectric film covering said surface of said first conductive portion including said surface feature;
a conductive layer covering said dielectric film;
said first conductive portion having an upper surface substantially parallel to said main surface; and
said upper surface of said first conductive portion having a polygonal form.

18. A semiconductor memory device having a storage region having an arrangement of a plurality of unit memory cells formed on the main surface of a semiconductor substrate of a first conductivity type, wherein each of said memory cells comprises:
a switching means formed on said main surface of said semiconductor substrate, and
a passive element for signal retention connected to said switching means for retaining the electric charges transferred from said switching means,
said switching means comprising:
a first and a second conduction electrodes; and
a gate electrode for controlling the conduction between said first and second conduction electrodes,
said passive element for signal retention comprising:
a first conductive portion having a generally columnar shape formed protruded from said main surface in a first direction away from said main surface, and electrically connected to said switching means,
said first conductive portion having an outer-peripheral surface, and
said first conductive portion having a surface feature comprising at least one concave region formed by two second conductive portions, located on and extending from said outer-peripheral surface of said first conductive portion;
a dielectric film covering said surface of said first conductive portion including said surface feature;
a conductive layer covering said dielectric film;
said first conductive portion having an upper surface substantially parallel to said main surface; and
said upper surface of said first conductive portion having a rectangular form.

19. A semiconductor memory device having a storage region having an arrangement of a plurality of unit memory cells formed on the main surface of a semiconductor substrate of a first conductivity type, wherein each of said memory cells comprises:
a switching means formed on said main surface of said semiconductor substrate, and
a passive element for signal retention connected to said switching means for retaining the electric charges transferred from said switching means,
said switching means comprising:
a first and a second conduction electrodes; and
a gate electrode for controlling the conduction between said first and second conduction electrodes,
said passive element for signal retention comprising:
a first conductive portion having a generally columnar shape formed protruded from said main surface in a first direction away from said main surface, and electrically connected to said switching means,
said first conductive portion having an outer-peripheral surface, and
said first conductive portion having a surface feature comprising at least one concave region formed by two second conductive portions, located on and extending from said outer-peripheral surface of said first conductive portion;
a dielectric film covering said surface of said first conductive portion including said surface feature;
a conductive layer covering said dielectric film;
said first conductive portion having an upper surface substantially parallel to said main surface; and
said upper surface of said first conductive portion having a hexagonal form.

20. A semiconductor memory device having a storage region having an arrangement of a plurality of unit memory cells formed on the main surface of a semiconductor substrate of a first conductivity type, wherein each of said memory cells comprises:
a switching means formed on said main surface of said semiconductor substrate, and
a passive element for signal retention connected to said switching means for retaining the electric charges transferred from said switching means,
said switching means comprising:
a first and a second conduction electrodes; and
a gate electrode for controlling the conduction between said first and second conduction electrodes,
said passive element for signal retention comprising:
a first conductive portion having a generally columnar shape formed protruded from said main surface in a first direction away from said main surface, and electrically connected to said switching means,
said first conductive portion having an outer-peripheral surface, and
said first conductive portion having a surface feature comprising at least one concave region formed by two second conductive portions, located on and extending from said outer-peripheral surface of said first conductive portion;

a dielectric film covering said surface of said first conductive portion including said surface feature;

a conductive layer covering said dielectric film;

said first conductive portion having an upper surface substantially parallel to said main surface; and said upper surface of said first conductive portion having an elliptical form.

21. A charge storage device formed as part of a memory cell on a semiconductor substrate having a main surface, comprising:

a first conductive portion formed as a geometric structure extending perpendicular to the main surface of said substrate, having an outer surface perpendicular to said main surface of said substrate and an upper surface parallel to said main surface of said substrate;

a second conductive portion formed by a plurality of fins extending from said outer surface of said geometric structure and formed along said outer surface of said geometric structure perpendicular to said main surface of said substrate;

a dielectric layer covering said first conductive portion and said second conductive portion; and a conductive layer covering said dielectric layer whereby said plurality of fins provide additional storage capacity to said geometric structure.

22. The charge storage device of claim 21 further comprising a concavity in said upper surface of said geometric structure forming an inner surface of said first conductive portion, said inner surface being covered by said dielectric layer and said dielectric layer being covered by said conductive layer, whereby additional storage capacity is added to said geometric structure.

23. The storage device of claim 22 wherein said plurality of fins is an even number.

24. The charge storage device of claim 22 wherein said geometric structure is a regular geometric shape.

25. The charge storage device of claim 24 wherein said upper surface of said regular geometric structure is in the shape of a circle.

26. The charge storage device of claim 24 wherein said upper surface of said regular geometric structure is in the shape of an ellipse.

27. The charge storage device of claim 24 wherein the upper surface of said regular geometric structure is in the shape of a polygon.

* * * * *